(12) United States Patent
Kim

(10) Patent No.: US 6,965,534 B2
(45) Date of Patent: Nov. 15, 2005

(54) RANDOM ACCESS MEMORY USING PRECHARGE TIMERS IN TEST MODE

(75) Inventor: Joonho Kim, Cary, NC (US)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/738,349

(22) Filed: Dec. 16, 2003

(65) Prior Publication Data

US 2005/0128837 A1    Jun. 16, 2005

(51) Int. Cl.$^7$ ................................. G11C 7/00
(52) U.S. Cl. ................. 365/203; 365/201; 365/233; 711/106; 714/721
(58) Field of Search ................. 365/203, 201, 365/233; 711/106; 714/721

(56) References Cited

U.S. PATENT DOCUMENTS

| 5,357,474 A | * | 10/1994 | Matano et al. ............... 365/203 |
| 5,995,426 A | * | 11/1999 | Cowles et al. ............... 365/201 |
| 6,205,068 B1 | * | 3/2001 | Yoon .......................... 365/203 |
| 6,272,588 B1 | * | 8/2001 | Johnston et al. ............ 711/106 |
| 6,512,711 B1 | | 1/2003 | Wright et al. |

\* cited by examiner

Primary Examiner—Anh Phung
Assistant Examiner—N. Nguyen
(74) Attorney, Agent, or Firm—Dicke, Billig & Czaja, PLLC

(57) ABSTRACT

Embodiments of the present invention are illustrated in a random access memory. In one embodiment, the random access memory includes memory banks and precharge timers configured to provide precharge signals to the memory banks. Each of the precharge timers corresponds to one of the memory banks and each of the precharge timers is configured to provide one of the precharge signals to the corresponding one of the memory banks in normal mode and in test mode.

32 Claims, 4 Drawing Sheets

RANDOM ACCESS MEMORY USING PRECHARGE TIMERS IN TEST MODE

BACKGROUND

One type of memory known in the art is dynamic random access memory (DRAM). DRAM, typically, includes a plurality of memory banks. Each memory bank includes one or more arrays of memory cells. The memory cells in each array of memory cells are arranged in rows and columns, with the rows extending along an x-direction and the columns extending along a y-direction. Conductive word lines extend across an array of memory cells along the x-direction and conductive bit lines extend across an array of memory cells along the y-direction. A memory cell is located at each cross-point of a word line and a bit line. Memory cells are accessed using a row address and a column address.

Each of the memory cells in an array of memory cells includes a capacitor and a transistor. The capacitor is electrically coupled through the transistor to one of the bit lines. The control input of the transistor is electrically coupled to one of the word lines. The transistor is switched on (conducting) to access the capacitor and off (non-conducting) to capture a voltage level on the capacitor. The capacitor is charged to a high voltage level that can represent a logic one or discharged to a low voltage level that can represent a logic zero.

Each bit line is electrically coupled to a sense amplifier and precharged to a precharge voltage level by a precharge voltage source. Prior to a read or write operation, the precharge voltage source is removed from the bit line and the bit line floats at the precharge voltage level. The sense amplifier can be a differential amplifier with one input electrically coupled to a bit line and the other input electrically coupled to a reference voltage level, such as the precharge voltage level.

During a read operation, the word line is activated to turn on the transistor. The voltage level stored on the capacitor is passed to the floating bit line to change the voltage level on the bit line to either a higher or lower voltage level than the precharge voltage level. The sense amplifier compares the voltage level on the bit line to the reference voltage level and provides a corresponding high or low voltage level response. In addition, the sense amplifier provides the response back to the memory cell through the bit line to charge or discharge the capacitor and store the voltage level just read back on the capacitor. The word line is deactivated to turn off the transistor and the bit line is precharged to the precharge voltage level to prepare for the next operation.

During a write operation, the word line is activated to turn on the transistor to access the capacitor through the bit line. Typically, a write driver circuit overdrives the sense amplifier to charge or discharge the capacitor through the bit line and transistor. The word line is deactivated to turn off the transistor and store the captured value on the capacitor. The bit line is precharged to the precharge voltage level to prepare for the next operation.

During normal operation, referred to as normal mode, each memory bank is accessed independently of the other memory banks. A read or write command is issued and one memory bank is addressed to read or write memory cells in the selected memory bank. The other memory banks are precharged as the selected memory bank is accessed. After data has been read from or written to the selected memory bank, the bit lines of the selected memory bank are precharged to the precharge voltage level to complete the read or write operation. Another command is issued to read or write memory cells in the same or another memory bank. Issuing one command to access and precharge one memory bank at a time is time consuming and, if used to test all of the memory banks, can lead to testing costs that exceed costs the market can bear.

During testing of the memory, the memory can be put into a special mode, referred to as test mode. In test mode, one read or write command is issued to simultaneously access a plurality of memory banks. The memory automatically transfers data to or from each of the simultaneously accessed memory banks in response to one read or write command. Multiple commands are not needed to access multiple memory banks. Data is transferred to or from each of the simultaneously accessed memory banks in data bursts that are time multiplexed or interleaved during the read or write operation. For example, during a test mode read operation on a two-memory bank DRAM, a first data bit from the first memory bank is provided on a data line followed by a first data bit from the second memory bank. Next, a second data bit from the first memory bank is provided on the data line followed by a second data bit from the second memory bank. The data burst from the first memory bank is not completed before beginning the data burst from the second memory bank. Test mode operation decreases testing time as compared to normal mode operation. However, precharging the memory banks at the appropriate time and in the proper sequence can be a difficult task.

SUMMARY

Embodiments of the present invention are illustrated in a random access memory. In one embodiment, the random access memory comprises memory banks and precharge timers configured to provide precharge signals to the memory banks. Each of the precharge timers corresponds to one of the memory banks and each of the precharge timers is configured to provide one of the precharge signals to the corresponding one of the memory banks in normal mode and in test mode.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
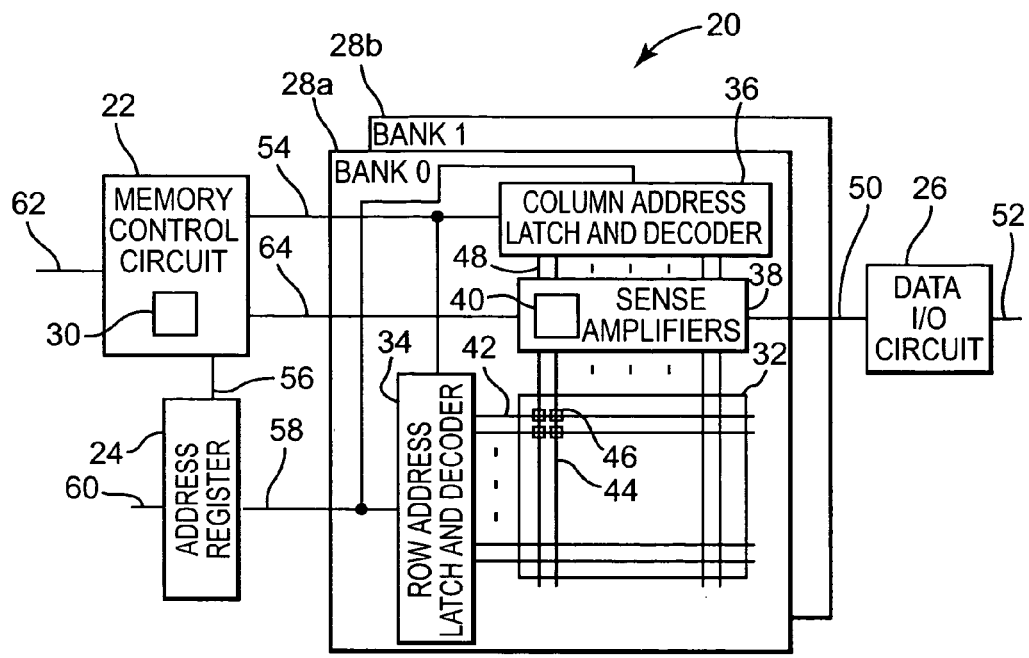
FIG. 1 is a block diagram illustrating a dynamic random access memory.

FIG. 1 is a block diagram illustrating a dynamic random access memory (DRAM) 20. The DRAM 20 includes a memory control circuit 22, an address register 24, a data input/output (I/O) circuit 26 and two memory banks, BANK 0 and BANK 1, indicated at 28a and 28b. In one embodiment, the DRAM 20 is a double data rate synchronous dynamic random access memory (DDR SDRAM).

The memory control circuit 22 includes a precharge control circuit 30 that automatically supplies one or more high voltage level memory bank precharge signals in response to an automatic precharge read or write command. The precharge control circuit 30 supplies a memory bank zero precharge signal to precharge memory bank 28a and a memory bank one precharge signal to precharge memory bank 28b. The sense amplifiers 38 include precharge bias circuits 40 that are activated by the high voltage level memory bank zero precharge signal to precharge memory bank 28a. Sense amplifiers in memory bank 28b include precharge bias circuits that are activated by the high voltage level memory bank one precharge signal to precharge memory bank 28b.

In normal operation or normal mode, precharge control circuit 30 supplies a memory bank precharge signal to automatically precharge the addressed memory bank 28a or 28b at the end of a read or write operation. In test mode, precharge control circuit 30 supplies memory bank zero and memory bank one precharge signals to sequentially activate the precharge bias circuits, such as precharge bias circuits 40, in memory banks 28a and 28b in response to one automatic precharge read or write command. In test mode, each of the memory banks 28a and 28b is precharged in response to one automatic precharge read or write command.

The memory bank 28a includes an array of memory cells 32, a row address latch and decoder 34, a column address latch and decoder 36 and sense amplifiers 38. The sense amplifiers 38 include the precharge bias circuits 40 that are activated by the precharge control circuit 30 to precharge memory bank 28a. Conductive word lines 42, referred to as row select lines, extend in the x-direction across the array of memory cells 32. Conductive bit lines 44, referred to as column select lines, extend in the y-direction across the array of memory cells 32. A memory cell 46 is located at each cross-point of a word line 42 and a bit line 44.

Each word line 42 is electrically coupled to row address latch and decoder 34 and each bit line 44 is electrically coupled to one of the sense amplifiers 38. The sense amplifiers 38 are electrically coupled to column address latch and decoder 36 through conductive column decoder lines 48. In addition, sense amplifiers 38 are electrically coupled to data I/O circuit 26 through data I/O lines 50. The data I/O circuit 26 is electrically coupled to data I/O pads or pins, referred to as DQ's, at 52.

The memory control circuit 22 is electrically coupled to row address latch and decoder 34 and column address latch and decoder 36 through conductive latch control lines 54. In addition, memory control circuit 22 is electrically coupled to address register 24 through a conductive signal path at 56. The address register 24 is electrically coupled to row address latch and decoder 34 and column address latch and decoder 36 through row and column address lines, indicated at 58. The address register 24 receives row and column address signals through conductive address lines at 60. The memory control circuit 22 receives control signals, including test mode, row address strobe (RAS) and column address strobe (CAS) signals, and read and write commands, including automatic precharge read and write commands through control lines at 62.

The memory control circuit 22 including the precharge control circuit 30 is electrically coupled to sense amplifiers 38 including the precharge bias circuits 40 through precharge control lines at 64. The precharge bias circuits 40 are coupled to bit lines 44, such that activation of the precharge bias circuits 40 precharges the bit lines 44 to a precharge voltage level. The memory control circuit 22 including the precharge control circuit 30 activates the precharge bias circuits 40 with the memory bank zero precharge signal to precharge memory bank 28a, i.e., to precharge bit lines 44.

Memory bank 28b includes all of the circuitry of memory bank 28a. In addition, memory bank 28b is electrically coupled to memory control circuit 22, address register 24 and data I/O circuit 26 similar to the way memory bank 28a is electrically coupled to memory control circuit 22, address register 24 and data I/O circuit 26. In one embodiment, the column address latch and decoder 36 is divided into one column address latch for all memory banks 28a and 28b and a column decoder in each of the memory banks 28a and 28b.

The memory control circuit 22 receives a test mode signal and an automatic precharge read or write command through control lines 62. The test mode signal sets the DRAM 20 to operate in normal mode, a low voltage level, or test mode, a high voltage level. In normal mode, the automatic precharge read or write command operates on one addressed memory bank 28a or 28b and the precharge control circuit 30 automatically precharges the addressed memory bank 28a or 28b at the end of the read or write operation. In test mode, the automatic precharge read or write command operates to test all of the memory banks 28a and 28b and the precharge control circuit 30 automatically precharges each of the memory banks 28a and 28b. The memory control circuit 22 also receives the RAS and CAS control signals for latching in the row address and column address, respectively.

The address register 24 receives a memory bank address for memory bank 28a or memory bank 28b in normal mode and supplies the memory bank address to memory control circuit 22 to read or write the addressed memory bank 28a or 28b. The address register 24 also receives a row address and supplies the row address to the row address latch and decoder 24. The memory control circuit 22 supplies the RAS signal to the row address latch and decoder 34 to latch the supplied row address into the row address latch and decoder 34. In addition, the address register 24 receives a column address and supplies the column address to the column address latch and decoder 36. The memory control circuit 22 supplies the CAS signal to the column address latch and decoder 36 to latch the supplied column address into the column address latch and decoder 36.

The data I/O circuits 26 include a plurality of data input buffers and latches that receive and transfer data from an external device to sense amplifiers 38. The data and an input data strobe (DQS) signal are supplied by an external device to data I/O circuits 26. The input DQS signal latches the data into the data I/O circuit 26 on each transition of the input DQS signal. The latched data is supplied to sense amplifiers 38 that store the data in selected memory cells 46 in memory banks 28a and 28b.

In addition, data I/O circuits 26 include a plurality of output latches that receive data read from selected memory cells 46 in memory banks 28a and 28b. The output data and an output data strobe (DQS) signal are supplied to the DQ's to be read by an external device. Data read from the selected memory cells 46 appear at the DQ's once access is complete and the output is enabled. At other times, the DQ's are in a high impedance state.

During a read operation of memory bank 28a in normal mode, memory control circuit 22 receives an automatic precharge read command and address register 24 receives the memory bank address for memory bank 28a and the row address of a selected memory cell or cells 46 to be read from memory bank 28a. The address register 24 passes the memory bank address for memory bank 28a to the memory control circuit 22 and the row address to the row address latch and decoder circuit 34. The memory control circuit 22 receives a high to low voltage level RAS signal and supplies the RAS signal to the row address latch and decoder circuit 34 to latch in the supplied row address. As the RAS signal transitions from a high to low voltage level, the memory control circuit 22 memory bank 28a and allow the bit lines 44 to float at the precharge voltage level.

The row address latch and decoder 34 decodes the latched row address and activates the selected word line 42. As the selected word line 42 is activated, the voltage value stored in each memory cell 46 that is coupled to the selected word line 42 is passed to the respective bit line 44. Each passed voltage value changes the voltage level on the bit line 44 to either a higher or lower voltage level than the precharge voltage level. The higher or lower voltage level on a bit line 44 is detected by one of the sense amplifiers 38. The address register 24 receives the column address of the selected memory cell or cells 46 and supplies the column address to the column address latch and decoder 36. The memory control circuit 22 receives a high to low voltage level CAS signal and supplies the CAS signal to the column address latch and decoder 36 to latch in the supplied column address. The column address latch and decoder 36 decodes the latched column address to select sense amplifiers 38 that pass data to data I/O circuit 26 for retrieval by an external circuit.

To read additional memory cells 46 from the addressed memory bank 28a and row in a data burst, the column address is changed and supplied to the column address latch and decoder 36. The column address latch and decoder 36 decodes the column address and selects sense amplifiers 38. The selected sense amplifiers 38 pass data to data I/O circuits 26 for retrieval by the external circuit.

The precharge control circuit 30 receives a memory bank zero precharge timer enable signal that indicates memory bank 28a is addressed at the beginning of the automatic precharge read command. In addition, the precharge control circuit 30 receives a data burst end signal that indicates the memory bank zero data burst is complete or nearly complete. In response to the data burst end signal, precharge control circuit 30 provides a high voltage level memory bank zero precharge signal that is passed through memory control circuit 22 to activate precharge bias circuits 40 and automatically precharge the bit lines 44 of memory bank 28a.

During a write operation of memory bank 28a in normal mode, memory control circuit 22 receives an automatic precharge write command and address register 24 receives the memory bank address for memory bank 28a and row address of a selected memory cell or cells 46 to be written in memory bank 28a. The address register 24 passes the memory bank address of memory bank 28a to memory control circuit 22 and the row address to the row address latch and decoder 34. The memory control circuit 22 receives a high to low voltage level RAS signal and supplies the RAS signal to the row address latch and decoder 34 to latch in the supplied row address. As the RAS signal transitions from a high to low voltage level, memory control circuit 22 deactivates precharge bias circuit 40 to stop precharging bit lines 44 in address memory bank 28a and allow the bit lines 44 to float at the precharge voltage level.

Data to be stored in the addressed memory bank 28a is supplied from an external source to the DQ's and data I/O circuits 26. The external source can also supply the input DQS signal that latches the received data into data I/O circuit 26.

The row address latch and decoder 34 decodes the latched row address and activates the selected word line 42. The address register 24 receives the column address of the selected memory cell or cells 46 and supplies the column address to the column address latch and decoder 36. The memory control circuit 22 receives a high to low voltage level CAS signal and supplies the CAS signal to the column address latch and decoder 36 to latch in the supplied column address. The column address latch and decoder 36 decodes the column address to select sense amplifiers that are passed the latched input data from data I/O circuits 26. The sense amplifiers 38 write the data into the selected memory cell or cells 46 through bit lines 44.

To write additional memory cells 46 in the addressed memory bank 28a and selected row in a data burst, the column address is changed and supplied to the column address latch and decoder 36. The column address latch and decoder 36 decodes the column address and selects different sense amplifiers 38. The selected sense amplifiers 38 are passed data from data I/O circuit 26 to write the data into the newly selected memory cell or cells 46. Changing the column address continues until the data burst is complete.

The precharge control circuit 30 receives a memory bank zero precharge timer enable signal that indicates memory bank 28a is addressed at the beginning of the automatic precharge write command. In addition, precharge control circuit 30 receives a data burst end signal that indicates the data burst is complete or nearly complete. In response, precharge control circuit 30 supplies a high voltage level memory bank zero precharge signal that is passed through memory control circuit 22 to activate precharge bias circuits 40 and automatically precharge the bit lines 44 of the addressed memory bank 28a.

During a read operation in test mode, memory control circuit 22 receives a high voltage level test mode signal and an automatic precharge read command. The address register 24 receives the row address of selected memory cell or cells 46. A memory bank address is not used in test mode as the DRAM 20 tests each memory bank 28a and 28b in response to one automatic precharge read or write command in test mode. The address register 24 supplies the row address to the row address latch and decoder 34 in each memory bank 28a and 28b. The memory control circuit 22 receives a high to low voltage level RAS signal and passes the RAS signal to row address latch and decoder 34 in each memory bank 28a and 28b to latch the supplied row address into the row address latch and decoder 34 in each memory bank 28a and 28b. As the RAS signal transitions from a high to low voltage level, the memory control circuit 22 deactivates the precharge bias circuits 40 in each memory bank 28a and 28b to stop precharging the bit lines 44 in each memory bank 28a and 28b and allow the bit lines 44 in each memory bank 28a and 28b to float at the precharge voltage level.

The row address latch and decoder 34 in each memory bank 28a and 28b decodes the latched row address and activates a selected word line 42 in each memory bank 28a and 28b. As the selected word line 42 in each memory bank 28a and 28b is activated, the voltage value stored in each memory cell 46 that is coupled to the activated word lines 42 is passed to the respective bit line 44. The passed voltage level changes the floating voltage level on the bit line 44 to either a higher or lower voltage level than the precharged voltage level. The higher or lower voltage level is detected by sense amplifiers 38.

The address register 24 receives a column address and supplies the column address to the column address latch and decoder 36 in each memory bank 28a and 28b. The memory control circuit 22 supplies a high to low voltage level CAS signal to each memory bank 28a and 28b to latch the supplied column address into the column address latch and decoder 36 in each memory bank 28a and 28b. The column address latch and decoder 36 in each memory bank 28a and 28b decodes the column address to select sense amplifiers 38 in each memory bank 28a and 28b that pass data to data I/O circuit 26. The memory banks 28a and 28b are alternately selected to supply data to data I/O circuit 26. In one embodiment, memory bank 28a is selected first, followed by memory bank 28b.

To read an additional memory cell or cells 46 from the activated row in each memory bank 28a and 28b in data bursts from each memory bank 28a and 28b, the column address is changed and supplied to the column address latch and decoder 36 in each memory bank 28a and 28b. The column address latch and decoder 36 in each memory bank 28a and 28b decodes the new column address to select new sense amplifiers 38 that pass data to data I/O circuit 26. The memory banks 28a and 28b are alternately selected to supply interleaved data to data I/O circuit 26. The process of changing the column address and reading new data continues until the data bursts are complete. In one embodiment, memory bank 28a is selected first, followed by memory bank 28b, followed by memory bank 28a, which is followed by memory bank 28b.

In test mode, precharge control circuit 30 receives a memory bank zero timer enable signal that indicates the automatic precharge read command has commenced beginning with memory bank 28a. In addition, the precharge control circuit 30 receives a data burst end signal that indicates the data burst from memory bank 28a is complete or nearly complete. In response, precharge control circuit 30 supplies high voltage level memory bank zero and memory bank one precharge signals sequentially to memory banks 28a and 28b. The high voltage level memory bank zero and memory bank one precharge signals activate precharge bias circuits 40 in each memory bank 28a and 28b to precharge the bit lines 44 of memory banks 28a and 28b. In one embodiment, precharge control circuit 30 supplies a high voltage level memory bank zero precharge signal to memory bank 28a, followed by a high voltage level memory bank one precharge signal to memory bank 28b.

During a write operation in test mode, memory control circuit 22 receives a high voltage level test mode signal and an automatic precharge write command. The address register 24 receives the row address of a selected memory cell or cells 46. A memory bank address is not needed in test mode as DRAM 20 tests each memory bank 28a and 28b in response to one automatic precharge read or write command. The address register 24 supplies the row address to the row latch and decoder 34 in each memory bank 28a and 28b. The memory control circuit 22 receives a high to low voltage level RAS signal and passes the RAS signal to row address latch and decoder 34 in each memory bank 28a and 28b to latch the supplied row address into the row address latch and decoder 34 in each memory bank 28a and 28b. As the RAS signal transitions from a high to a low voltage level, memory control circuit 22 deactivates precharge bias circuits 40 in each memory bank 28a and 28b to stop precharging the bit lines 44 in each memory bank 28a and 28b and allow the bit lines 44 to float at the precharge voltage level. The row address latch and decoder 34 in each memory bank 28a and 28b decodes the latched row address and activates a selected word line 42 in each memory bank 28a and 28b.

Data to be stored in memory banks 28a and 28b are supplied from an external source to the DQ's and data I/O circuit 26. The external source can also supply the input DQS signal that latches the received data into the data I/O circuits 26.

The address register 24 receives the column address of a selected memory cell or cells 46 and supplies the column address to the column address latch and decoder 36 in each memory bank 28a and 28b. The memory control circuit 22 supplies a high to low voltage level CAS signal to each memory bank 28a and 28b to latch the supplied column address into the column address latch and decoder 36 in each memory bank 28a and 28b. The column address latch and decoder 36 in each memory bank 28a and 28b decodes the column address to select sense amplifiers 38 in each memory bank 28a and 28b that receive data passed by data I/O circuit 26. The selected sense amplifiers write received data into the selected memory cells 46. The memory banks 28a and 28b are alternately selected to receive data supplied from data I/O circuits 26. In one embodiment, memory bank 28a is selected first, followed by memory bank 28b.

To write an additional memory cell or cells 46 in the addressed row of each memory bank 28a and 28b in data bursts for each memory bank 28a and 28b, the column address is changed and supplied to the column address latch and decoder 36 in each memory bank 28a and 28b. The column address latch and decoder 36 in each memory bank 28a and 28b decodes the changed column address to select sense amplifiers 38 that receive data from data I/O circuit 26 and write the received data into memory banks 28a and 28b. The memory banks 28a and 28b are alternately selected to receive data from data I/O circuit 26. In one embodiment, data is interleaved such that with two memory banks 28a and 28b and a data burst of two for each memory bank 28a and 28b, data is first supplied and written into memory bank 28a, followed by memory bank 28b, followed by changing the column address and again writing supplied data into memory bank 28a, followed by memory bank 28b.

The precharge control circuit 30 receives a memory bank zero precharge timer enable signal that indicates the automatic precharge write command has commenced beginning with memory bank 28a. In addition, the precharge control circuit 30 receives a data burst end signal that indicates the data burst to memory bank 28a is complete or nearly complete. In response, precharge control circuit 30 supplies high voltage level memory bank zero and memory bank one precharge signals sequentially to memory banks 28a and 28b. The high voltage level memory bank precharge signals activate precharge bias circuits 40 in each memory bank 28a and 28b to precharge the bit lines 44 of the respective memory banks 28a and 28b. In one embodiment, precharge control circuit 30 supplies a high voltage level memory bank zero precharge signal to memory bank 28a, followed by a high voltage level memory bank one precharge signal to memory bank 28b.

Figure 2:
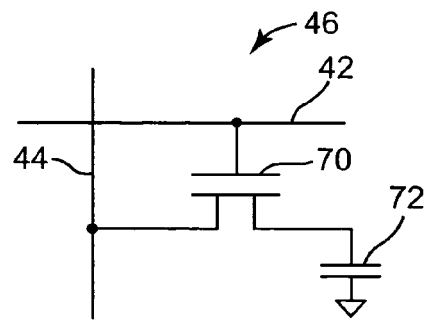
FIG. 2 is a diagram illustrating one embodiment of a memory cell in the array of memory cells in the dynamic random access memory.

FIG. 2 is a diagram illustrating one embodiment of a memory cell 46 in the array of memory cells 32. Memory cell 46 includes a transistor 70 and a capacitor 72. The gate of transistor 70 is electrically coupled to word line 42. One side of the drain-source path of transistor 70 is electrically coupled to bit line 44 and the other side of the drain-source path is electrically coupled to one side of capacitor 72. The other side of capacitor 72 is electrically coupled to a reference voltage, such as one half the supply voltage. The capacitor 72 can be charged to a high voltage level, such as the supply voltage level, to represent a logic one, and the capacitor 72 can be discharged to a low voltage level, such as ground or zero volts, to represent a logic zero.

The precharge bias circuit 40 precharges bit line 44 to a precharge voltage level, such as one half the supply voltage level. Prior to activating the word line 42 in a read or write operation, precharge bias circuit 40 is deactivated and bit line 44 floats at the precharge voltage level.

Each of the sense amplifiers 38 are comparator circuits with one input tied to a bit line, such as bit line 44, and the other input tied to a reference voltage, such as one half the supply voltage. In one embodiment, bit line 44 floats at the precharge voltage level of one half the supply voltage and the comparator reference voltage input is held at one half the supply voltage.

During a read operation, as word line 42 is activated to turn on transistor 70, the high voltage level or low voltage level stored on capacitor 72 is passed to the floating bit line 44. This changes the voltage on bit line 44 by charging bit line 44 to a higher voltage level or discharging bit line 44 to a lower voltage level. In one embodiment, bit line 44 is charged to a higher voltage level than one half the supply voltage or discharged to a lower voltage level than one half the supply voltage. One of the sense amplifiers 38 detects the higher or lower voltage level on bit line 44 and supplies a high voltage level, such as the supply voltage level, or a low voltage level, such as zero volts, to data I/O circuit 26. In addition, sense amplifiers 38 supply the high voltage level or low voltage level to the capacitor 72 that was just read to restore the voltage level on capacitor 72. The word line 42 is deactivated and precharge bias circuit 40 is activated to precharge bit line 44 to the precharge voltage level.

During a write operation, word line 42 is activated to turn on transistor 70 and access capacitor 72. A write circuit overdrives the respective sense amplifier 38 with a high voltage level or a low voltage level and the sense amplifier 38 stores the provided voltage level on capacitor 72. The word line 42 is deactivated and the precharge bias circuit 40 is activated to precharge bit line 44 to the precharge voltage level.

The read operation on memory cell 46 is a destructive read operation. After each read operation, capacitor 72 is charged or discharged to the low or high voltage level that was just read. In addition, even without a read operation, the charge on capacitor 72 changes over time. To retain a stored value, memory cell 46 is periodically refreshed by reading or writing the memory cell 46. All memory cells 46 in the array of memory cells 32 are periodically refreshed to maintain their values.

In DDR SDRAM, the read and write operations are synchronized to a system clock. The system clock is supplied by a host system that includes the DDR SDRAM. DDR SDRAM operates from a differential clock, CK and bCK. The crossing of CK going high and bCK going low is referred to as the positive edge of CK. Commands such as read and write operations, including address and control signals, are registered at the positive edge of CK. Operations are formed on both the rising and falling edges of the system clock.

The DDR SDRAM uses a double data rate architecture to achieve high-speed operation. The double data rate architecture is essentially a 2n prefetch architecture with an interface designed to transfer two data words per clock cycle at the DQ's. A single read or write access for the DDR SDRAM effectively consists of a single 2n bit wide, one clock cycle data transfer at the internal memory array and two corresponding n bit wide, one half clock cycle data transfers at the DQ's.

An input DQS signal is transmitted by an external device along with input data during write operations. The input DQS signal is center aligned with the input data that is registered in the DDR SDRAM on both edges of the input DQS signal. An output DQS signal is transmitted by the DDR SDRAM during read operations. The output DQS signal is edge aligned with output data that is registered by an external device on both edges of the output DQS signal.

Read and write accesses to a DDR SDRAM are burst oriented. Accesses start at a selected location and continue for a programmed number of locations. Accesses begin with the registration of an automatic precharge read or write command. The address bits registered coincident with the automatic precharge read or write command are used to select the memory bank 28a and 28b and the column to be accessed. The address bits subsequently registered select the column locations for the burst access.

The DDR SDRAM in the preceding description is referred to as DDR-I SDRAM for being the first generation of DDR SDRAM. The next generation of DDR SDRAM, DDR-II SDRAM has the same features as DDR-I SDRAM except the data rate is doubled. The DDR-II SDRAM architecture is essentially a 4n prefetch architecture with an interface designed to transfer four data words per clock cycle at the DQ's. A single read or write access for the DDR-II SDRAM effectively consists of a single 4n bit wide, one clock cycle data transfer at the internal memory array and four corresponding n bit wide, one quarter clock cycle data transfers at the DQ's. In one embodiment, DRAM 20 is a DDR-I SDRAM and in one embodiment, DRAM 20 is a DDR-II SDRAM.

Figure 3:
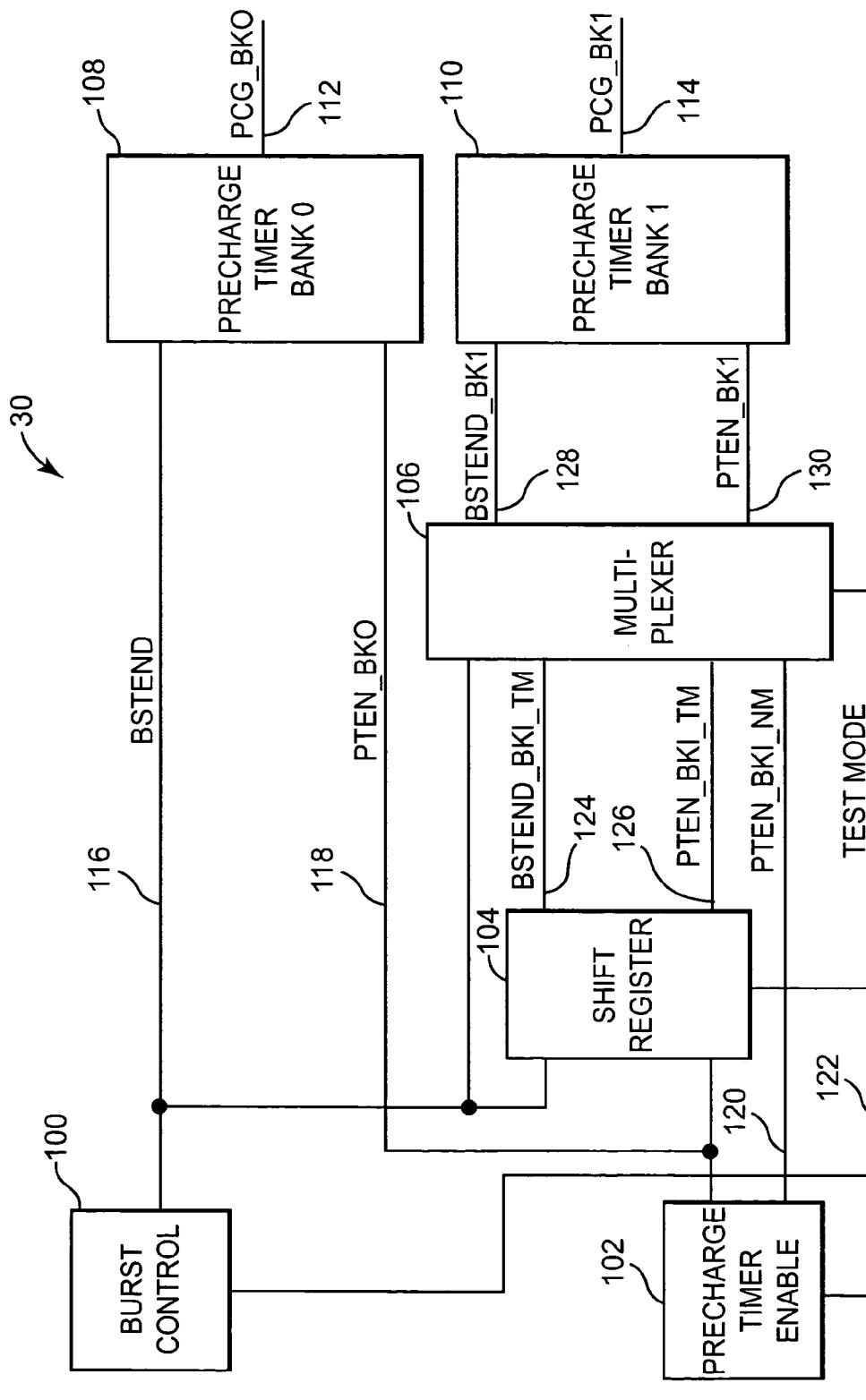
FIG. 3 is a diagram illustrating a precharge control circuit in the dynamic random access memory.

FIG. 3 is a diagram illustrating the precharge control circuit 30. The precharge control circuit 30 includes a burst control circuit 100, a precharge timer enable circuit 102, a shift register 104, a multiplexer 106, a memory bank zero precharge timer 108 and a memory bank one precharge timer 110. The memory bank zero precharge timer 108 supplies a memory bank zero precharge signal PCG_BK0 on precharge signal path 112 that activates the precharge bias circuits 40 in memory bank 28a. The memory bank one precharge timer 110 supplies a memory bank one precharge signal PCG_BK1 on precharge signal path 114 that activates the precharge bias circuits in memory bank 28b. In other embodiments, DRAM 20 includes more than two memory banks 28a and 28b and the precharge control circuit 30 includes additional circuitry and precharge timers that supply memory bank precharge signals to the additional memory banks.

The burst control circuit 100 is electrically coupled through burst end signal path 116 to a first input on shift register 104, a first input on multiplexer 106 and a first input on memory bank zero precharge timer 108. The precharge timer enable circuit 102 is electrically coupled through memory bank zero precharge timer enable signal path 118 to a second input on shift register 104 and a second input on memory bank zero precharge timer 108. The precharge timer enable circuit 102 is also electrically coupled through a normal mode memory bank one precharge timer enable signal path 120 to a second input of multiplexer 106. In addition, the precharge timer enable circuit 102 is electrically coupled to a test mode signal path 122. The test mode signal path 102 is electrically coupled to an input of the precharge timer enable circuit 102, an input of the burst control circuit 100, a third input of shift register 104 and a third input of multiplexer 106.

The shift register 104 is electrically coupled through test mode memory bank one burst end signal path 124 to a fourth input of multiplexer 106 and through test mode memory bank one precharge timer enable signal path 126 to a fifth input of multiplexer 106. The multiplexer 106 is electrically coupled through memory bank one burst end signal path 128 to a first input of memory bank one precharge timer 110 and through memory bank one precharge timer enable signal path 130 to a second input of memory bank one precharge timer 110.

The burst control circuit 100 responds to an automatic precharge command by supplying a burst end pulse in the burst end signal BSTEND on signal path 116. The burst control circuit 100 supplies the burst end pulse in response to either an automatic precharge read command or an automatic precharge write command. In normal mode, an automatic precharge command is supplied with a memory bank address. The burst control circuit 100 responds with a burst end pulse that indicates the end of the data burst from the addressed memory bank 28a or 28b. In test mode, an automatic precharge command can be supplied without a memory bank address as the memory bank address is not used in test mode. The burst control circuit 100 responds with a burst end pulse that indicates the end of the data burst from memory bank 28a.

The precharge timer enable circuit 102 responds to an automatic precharge command by supplying a memory bank precharge timer enable pulse. The precharge timer enable circuit 102 supplies the memory bank precharge timer enable pulse in response to either an automatic precharge read or write command. In normal mode, an automatic precharge command is supplied with a memory bank address. The precharge timer enable circuit 102 responds with a precharge timer enable pulse as part of the precharge timer enable signal for the addressed memory bank 28a or 28b. The precharge timer enable circuit 102 supplies a memory bank zero precharge timer enable pulse in the memory bank zero precharge timer enable signal PTEN_BK0 on signal path 118 for memory bank 28a and a normal mode memory bank one precharge timer enable pulse in the normal mode memory bank one precharge timer enable signal PTEN_BK1_NM on signal path 120 for memory bank 28b. In test mode, precharge timer enable circuit 102 supplies the memory bank zero precharge timer enable pulse on signal path 118 in response to an automatic precharge command. The precharge timer enable circuit 102 does not provide a normal mode memory bank one precharge timer enable pulse while in test mode.

The shift register 104 receives the burst end pulses on signal path 116 and memory bank zero precharge timer enable pulses on signal path 118. In normal mode, shift register 104 supplies constant low voltage levels on signal paths 124 and 126. In test mode, shift register 104 shifts a received burst end pulse by one clock cycle and supplies the result as a test mode memory bank one burst end pulse in the test mode memory bank one burst end signal BSTEND_BK1_TM on signal path 124. In addition, shift register 104 shifts a received memory bank zero precharge enable pulse by one clock cycle and supplies the result as a test mode memory bank one precharge timer enable pulse in the test mode memory bank one precharge timer enable signal PTEN_BK1_TM on signal path 126.

The multiplexer 106 receives the burst end pulses, normal mode memory bank one precharge timer enable pulses, test mode memory bank one burst end pulses and test mode memory bank one precharge timer enable pulses. In normal mode, multiplexer 106 transfers received burst end pulses as memory bank one burst end pulses in memory bank one burst end signal BSTEND_BK1 on signal path 128. In addition, multiplexer 106 transfers received normal mode memory bank one precharge timer enable pulses as memory bank one precharge timer enable pulses in the memory bank one precharge timer enable signal PTEN_BK1 on signal path 130. In test mode, multiplexer 106 transfers received test mode memory bank one burst end pulses as memory bank one burst end pulses on signal path 128. In addition, multiplexer 106 transfers received test mode memory bank one precharge timer enable pulses as memory bank one precharge timer enable pulses on signal path 130.

The mode of the burst control circuit 100, precharge timer enable circuit 102, shift register 104 and multiplexer 106 is set by a test mode signal TEST MODE supplied on signal path 122. A low voltage level indicates normal mode and a high voltage level indicates test mode.

The memory bank zero precharge timer 108 supplies the memory bank zero precharge signal PCG_BK0 to activate the precharge bias circuits 40 in memory bank 28a and precharge bit lines 44. The memory bank zero precharge timer 108 is enabled as it receives a memory bank zero precharge timer enable pulse. If memory bank zero precharge timer 108 is enabled and it receives a burst end pulse, memory bank zero precharge timer 108 supplies a high voltage level memory bank zero precharge signal PCG_BK0 to precharge memory bank 28a. In one embodiment employing a synchronous automatic precharge scheme, the high voltage level memory bank zero precharge signal PCG_BK0 is supplied one clock cycle after the received burst end pulse. In one embodiment employing an asynchronous automatic precharge scheme, the high voltage level memory bank zero precharge signal PCG_BK0 is supplied after an asynchronous time period, such as less than one clock cycle.

The memory bank one precharge timer 110 supplies a memory bank one precharge signal PCG_BK1 to activate the precharge bias circuit in memory bank 28b and precharge bit lines. The memory bank one precharge timer 110 is enabled as it receives a memory bank one precharge timer enable pulse. If memory bank one precharge timer 110 is enabled and it receives a memory bank one burst end pulse, memory bank one precharge timer 110 supplies a high voltage level memory bank one precharge signal PCG_BK1 to precharge memory bank 28b. In one embodiment employing a synchronous automatic precharge scheme, the high voltage level memory bank one precharge signal PCG_BK1 is supplied one clock cycle after the memory bank one burst end pulse. In one embodiment employing an asynchronous automatic precharge scheme, the high voltage level memory bank one precharge signal PCG_BK1 is supplied after an asynchronous time period, such as less than one clock cycle.

In normal mode operation, memory control circuit 22 receives an automatic precharge read or write command and address register 24 receives a memory bank address, such as the address for memory bank 28a. With memory bank 28a addressed, precharge timer enable circuit 102 supplies a memory bank zero precharge timer enable pulse to memory bank zero precharge timer 108 and shift register 104 on signal path 118. The memory bank zero precharge timer enable pulse enables memory bank zero precharge timer 108. The shift register 104 provides a low voltage level signal on signal path 126. At the end of the memory bank zero data burst, burst control circuit 100 supplies a burst end pulse on signal path 116 to memory bank zero precharge timer 108, shift register 104 and multiplexer 106. Shift register 104 provides a low voltage level signal on signal path 124 and multiplexer 106 passes the burst end pulse to memory bank one precharge timer 110 on signal path 128. Also, as multiplexer 106 did not receive a normal mode memory bank one precharge timer enable pulse on signal path 120, multiplexer 106 maintains a low voltage level on signal path 130.

In response to the burst end pulse, the enabled memory bank zero precharge timer 108 supplies a high voltage level memory bank zero precharge signal PCG_BK0 to precharge bias circuits 40 in memory bank 28a to precharge the bit lines 44 in memory bank 28a. Since memory bank one precharge timer 110 was not enabled through signal path 130, memory bank one precharge timer 110 does not respond to the memory bank one burst end pulse received on signal path 128. Instead, memory bank one precharge timer 110 maintains signal path 114 at a low voltage level. In one embodiment configured in a synchronous automatic precharge scheme, memory bank zero precharge timer 108 supplies the high voltage level memory bank zero precharge signal PCG_BK0 one clock cycle after receiving the burst end pulse. In one embodiment configured in an asynchronous automatic precharge scheme, memory bank zero precharge timer 108 supplies the high voltage level memory bank zero precharge signal PCG_BK0 asynchronously, such as in less than one clock cycle, after the burst end pulse.

In another normal mode operation, memory control circuit 22 receives an automatic precharge read or write command and address register 24 receives an address for memory bank 28b. With memory bank 28b addressed, precharge timer enable circuit 102 supplies a normal mode memory bank one precharge timer enable pulse to multiplexer 106 on signal path 120. Multiplexer 106 passes the normal mode memory bank one precharge timer enable pulse as a memory bank one precharge timer enable pulse on signal path 130 to memory bank one precharge timer 110. The memory bank one precharge timer enable pulse enables memory bank one precharge timer 110. At the end of the memory bank one data burst, burst control circuit 100 supplies a burst end pulse on signal path 116 to memory bank zero precharge timer 108, shift register 104 and multiplexer 106. As memory bank zero precharge timer 108 was not enabled, memory bank zero precharge timer 108 does not respond to the burst end pulse. Also, in normal mode, shift register 104 maintains signal paths 124 and 126 at a low voltage level. Multiplexer 106 passes the burst end pulse to memory bank one precharge timer 110 as a memory bank one burst end pulse on signal path 128. In response to the memory bank one burst end pulse, the enabled memory bank one precharge timer 110 supplies a high voltage level memory bank one precharge signal PCG_BK1 to precharge bias circuits in memory bank 28b to precharge the bit lines in memory bank 28b. In one embodiment configured in a synchronous automatic precharge scheme, memory bank one precharge timer 110 supplies the high voltage level memory bank one precharge signal PCG_BK1 one clock cycle after receiving the memory bank one burst end pulse. In one embodiment configured in an asynchronous automatic precharge scheme, memory bank one precharge timer 110 supplies the high voltage level memory bank one precharge signal PCG_BK1 asynchronously, such as within one clock cycle, after the memory bank one burst end pulse.

In test mode operation, a high voltage level test mode signal TEST MODE is supplied on signal path 122 and memory control circuit 22 receives an automatic precharge read or write command. In response to the automatic precharge command in test mode, precharge timer enable circuit 102 supplies a memory bank zero precharge timer enable pulse on signal path 118 to memory bank zero precharge timer 108 and shift register 104. The memory bank zero precharge timer enable pulse on signal path 118 enables memory bank zero precharge timer 108. Shift register 104 receives the memory bank zero precharge timer enable pulse on signal path 118 and one clock cycle later supplies a test mode memory bank one precharge timer enable pulse on signal path 126. Multiplexer 106 receives the test mode memory bank one precharge timer enable pulse on signal path 126 and supplies a memory bank one precharge timer enable pulse to memory bank one precharge timer 110 on signal path 130. The memory bank one precharge timer enable pulse on signal path 130 enables memory bank one precharge timer 110.

In test mode, the memory bank zero data burst is interleaved with the memory bank one data burst. A first bit in the memory bank zero data burst is followed by a first bit in the memory bank one data burst, that is followed by a second bit in the memory bank zero data burst, that is followed by a second bit in the memory bank one data burst. At the end of the memory bank zero data burst, burst control circuit 100 supplies a burst end pulse on signal path 116 to memory bank zero precharge timer 108, shift register 104 and multiplexer 106. The enabled memory bank zero precharge timer 108 receives the burst end pulse and supplies a high voltage level memory bank zero precharge signal PCG_BK0 to precharge bias circuits 40 in memory bank 28a to precharge the bit lines 44 in memory bank 28a. In one embodiment configured in a synchronous precharge scheme, memory bank zero precharge timer 108 supplies the high voltage level memory bank zero precharge signal PCG_BK0 one clock cycle after the burst end pulse. In one embodiment configured in an asynchronous precharge scheme, memory bank zero precharge timer 108 supplies the high voltage level memory bank zero precharge signal PCG_BK0 asynchronously, such as within one clock cycle, of the burst end pulse.

Shift register 104 receives the burst end pulse on signal path 116 and in response supplies a test mode memory bank one burst end pulse on signal path 124 one clock cycle after receiving the burst end pulse on signal path 116. Multiplexer 106 receives the test mode memory bank one burst end pulse on signal path 124 and in response supplies a memory bank one burst end pulse on signal path 128 to memory bank one precharge timer 110. The enabled memory bank one precharge timer 110 receives the memory bank one burst end pulse and supplies a high voltage level memory bank one precharge signal PCG_BK1 to the precharge bias circuits in memory bank 28b to precharge the bit lines in memory bank 28b. In one embodiment configured in a synchronous precharge scheme, the memory bank one precharge timer 110 supplies the high voltage level memory bank one precharge signal PCG_BK1 one clock cycle after the memory bank one burst end pulse. In one embodiment configured in an asynchronous precharge scheme, memory bank one precharge timer 110 supplies the high voltage level memory bank one precharge signal PCG_BK1 asynchronously, such as within one clock cycle, of the memory bank one burst end pulse.

Figure 4:
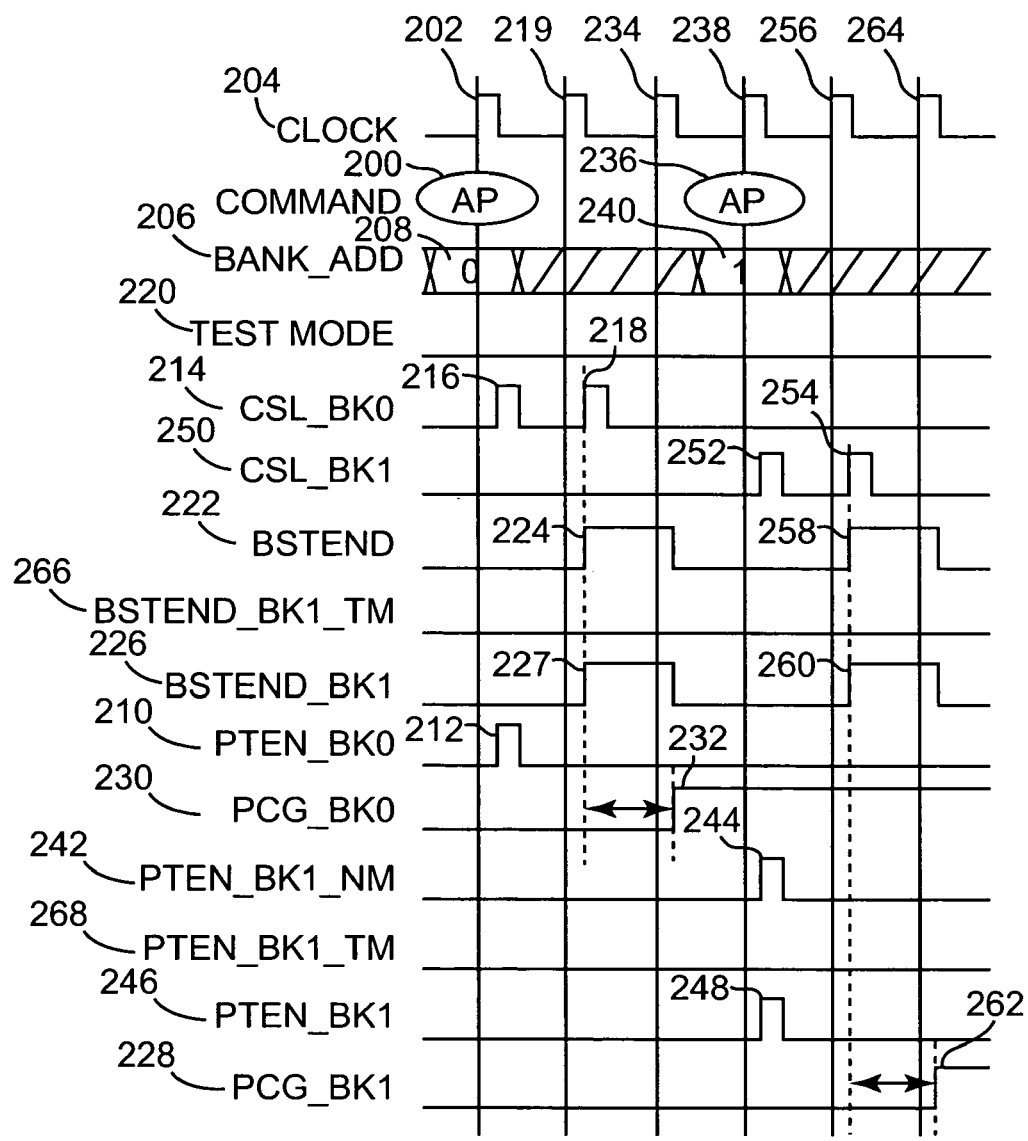
FIG. 4 is a timing diagram illustrating normal mode operation of the precharge control circuit.

FIG. 4 is a timing diagram illustrating normal mode operation of precharge control circuit 30. Each of the memory banks 28a and 28b supplies a data burst that is two data bits long. An automatic precharge (AP) read or write COMMAND 200 is supplied to memory control circuit 22 at a first rising edge 202 of system clock signal CLOCK 204. In addition, memory bank address signals BANK_ADD at 206 provide a memory bank zero address at 208 for memory bank 28a at the first rising edge 202 of clock signal CLOCK 204. The test mode signal TEST MODE at 220 is held at a low voltage level to keep DRAM 20 in normal mode.

The precharge timer enable circuit 102 supplies memory bank zero precharge timer enable signal PTEN_BK0 at 210. In response to AP COMMAND 200 and memory bank zero address 208, precharge timer enable circuit 102 supplies a memory bank zero precharge timer enable pulse at 212. The memory bank zero column select signal CSL_BK0 at 214 pulses at 216 to transfer a first bit in the memory bank zero two bit data burst and pulses at 218, after the second rising edge 219 of clock signal CLOCK 204, to transfer a second bit in the memory bank zero two bit data burst.

Burst control circuit 100 supplies burst end signal BSTEND at 222. As memory bank zero column select signal CSL_BK0 214 pulses at 218, burst control circuit 100 supplies a burst end pulse at 224 to memory bank zero precharge timer 108 and multiplexer 106. Memory bank zero precharge timer 108 supplies the memory bank zero precharge signal PCG_BK0 230. Since memory bank zero precharge timer 108 was enabled, memory bank zero precharge timer 108 sets the memory bank zero precharge signal PCG_BK0 230 to a high voltage level at 232. In one embodiment configured in a synchronous automatic precharge scheme, memory bank zero precharge timer 108 supplies the high voltage level memory bank zero precharge signal PCG_BK0 at 232 after the third rising edge 234 of clock signal 204 and one clock cycle after the rising edge of burst end pulse 224. In one embodiment configured in an asynchronous automatic precharge scheme, memory bank zero precharge timer 108 supplies the high voltage level memory bank zero precharge signal PCG_BK0 asynchronously, such as prior to the third rising edge 234 of clock signal CLOCK 204.

Multiplexer 106 supplies the memory bank one burst end signal BSTEND_BK1 at 226 and in response to the burst end pulse at 224, multiplexer 106 supplies the memory bank one burst end pulse at 227 to memory bank one precharge timer 110. The memory bank one precharge timer 110 supplies the memory bank one precharge signal PCG_BK1 228. However, since memory bank one precharge timer 110 was not enabled, memory bank one precharge timer 110 maintains memory bank one precharge signal PCG_BK1 228 at a low voltage level.

A second AP read or write COMMAND 236 is supplied to memory control circuit 22 at a fourth rising edge 238 of clock signal CLOCK 204. In addition, a memory bank one address at 240 for memory bank 28b is supplied at the fourth rising edge 238 of clock signal CLOCK 204. The precharge timer enable circuit 102 supplies the normal mode memory bank one precharge timer enable signal PTEN_BK1_NM at 242 and in response to AP COMMAND 236 and memory bank one address 240 supplies a normal mode memory bank one precharge timer enable pulse at 244 to multiplexer 106. The multiplexer 106 supplies the memory bank one precharge timer enable signal PTEN_BK1 246. In response to normal mode memory bank one precharge timer enable pulse 244, multiplexer 106 supplies a memory bank one precharge timer enable pulse at 248 that enables memory bank one precharge timer 110.

The memory bank one column select signal CSL_BK1 at 250 pulses at 252 to transfer a first bit in the memory bank one two bit data burst and pulses at 254, after the fifth rising edge 256 of clock signal CLOCK 204, to transfer a second bit in the memory bank one two bit data burst. As the memory bank one column select signal CSL_BK1 250 pulses at 254, burst control circuit 100 supplies a burst end pulse at 258 to memory bank zero precharge timer 108 and multiplexer 106. Memory bank zero precharge timer 108 was not reset or enabled by AP COMMAND 236 and memory bank one address 240 and memory bank zero precharge timer 108 maintains memory bank zero precharge signal PCG_BK0 230 at a high voltage level.

Multiplexer 106 supplies the memory bank one burst end pulse at 260 to memory bank one precharge timer 110 in response to the burst end pulse 258. The enabled memory bank one precharge timer 110 supplies a high voltage level memory bank one precharge signal PCG_BK1 at 262 in response to the memory bank one burst end pulse at 260. In one embodiment configured in a synchronous automatic precharge scheme, the memory bank one precharge timer 110 supplies the high voltage level memory bank one precharge signal PCG_BK1 at 262 after the sixth rising edge 264 of clock signal CLOCK 204 and one clock cycle after the rising edge of memory bank one burst end pulse 260. In one embodiment configured in an asynchronous automatic precharge scheme, memory bank one precharge timer 110 supplies the high voltage level memory bank one precharge signal PCG_BK1 asynchronously, such as prior to the sixth rising edge 264 of clock signal CLOCK 204.

Shift register 104 supplies test mode memory bank one burst end signal BSTEND_BK1_TM 266 and test mode memory bank one precharge timer enable signal PTEN_BK1_TM 268. In normal mode, shift register 104 supplies a low voltage level for each of the signals BSTEND_BK1_TM 266 and PTEN_BK1_TM 268. Also, memory bank zero precharge timer 108 is reset to supply a low voltage level memory bank zero precharge signal PCG_BK0 230 prior to executing the next AP COMMAND that addresses memory bank 28a, and memory bank one precharge timer 110 is reset to supply a low voltage level memory bank one precharge signal PCG_BK1 228 prior to executing the next AP COMMAND that addresses memory bank 28b.

Figure 5:
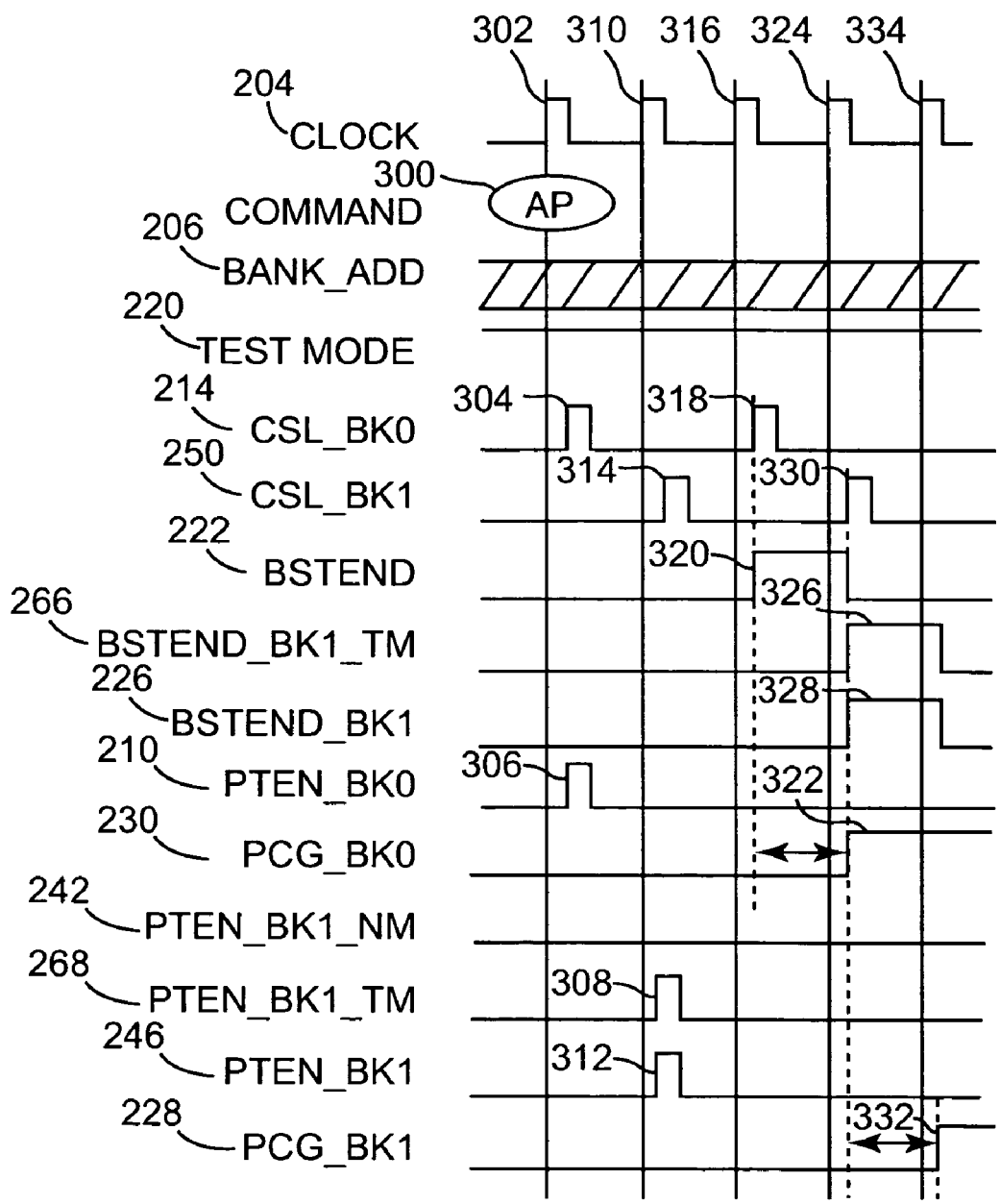
FIG. 5 is a timing diagram illustrating test mode operation of the precharge control circuit.

FIG. 5 is a timing diagram illustrating test mode operation of precharge control circuit 30. The test mode signal TEST MODE 220 is held at a high voltage level to keep DRAM 20 in test mode. In test mode, each of the memory banks 28a and 28b supplies a two bit data burst. The data burst from memory bank 28a is interleaved with the data burst from memory bank 28b.

An AP read or write COMMAND 300 is supplied at a first rising edge 302 of clock signal CLOCK 204. A memory bank address does not need to be supplied through memory bank address signals BANK_ADD 206 as a memory bank address is not used in test mode. The memory bank zero column select signal CSL_BK0 214 pulses at 304 to transfer a first bit in the memory bank zero two bit data burst.

The precharge timer enable circuit 102 supplies a memory bank zero precharge timer enable pulse at 306 in response to AP COMMAND 300. The memory bank zero precharge timer enable pulse 306 is supplied to memory bank zero precharge timer 108 and shift register 104. The memory bank zero precharge timer enable pulse 306 enables memory bank zero precharge timer 108. Shift register 104 receives the memory bank zero precharge timer enable pulse 306 and one clock cycle later supplies a test mode memory bank one precharge timer enable pulse at 308. The test mode memory bank one precharge timer enable pulse 308 is supplied to multiplexer 106 after the second rising edge 310 of clock signal CLOCK 204. Multiplexer 106 receives the test mode memory bank one precharge timer enable pulse 308 and supplies a memory bank one precharge timer enable pulse 312 to enable memory bank one precharge timer 110. The precharge timer enable circuit 102 maintains the normal mode memory bank one precharge timer enable signal PTEN_BK1_NM 242 at a low voltage level in test mode. The memory bank one column select signal CSL_BK1 at 250 pulses at 314 to transfer a first bit in the memory bank one two bit data burst.

After the third rising edge 316 of clock signal CLOCK 204, memory bank zero column select signal CSL_BK0 214 pulses at 318 to transfer the second and last data bit of the memory bank zero data burst. In response to the end of the memory bank zero data burst, burst control 100 supplies a burst end pulse at 320 to memory bank zero precharge timer 108 and shift register 104. The memory bank zero precharge timer 108 receives burst end pulse 320 and supplies a high voltage level at 322 as the memory bank zero precharge signal PCG_BK0 230. The high voltage level at 322 activates the precharge bias circuits 40 to precharge the bit lines 44 in memory bank 28a. In one embodiment of a synchronous precharge scheme, memory bank zero precharge signal PCG_BK0 230 is set to a high voltage level at 322 after the fourth rising edge 324 of clock signal CLOCK 204 and one clock cycle after the rising edge of burst end pulse 320. In one embodiment of an asynchronous precharge scheme, memory bank zero precharge signal PCG_BK0 230 is set to a high voltage level at 322 asynchronously, such as within one clock cycle of the rising edge of burst end pulse 320.

The shift register 104 receives burst end pulse 320 and one clock cycle later supplies test mode memory bank one burst end pulse 326. Multiplexer 106 receives test mode memory bank one burst end pulse 326 and supplies memory bank one burst end pulse 328 to memory bank one precharge timer 110. In addition, memory bank one column select signal CSL_BK1 250 pulses at 330 to transfer the second and last data bit of the memory bank one data burst. The memory bank one precharge timer 110 receives memory bank one burst end pulse 328 and supplies a high voltage level at 332 as the memory bank one precharge signal PCG_BK1 228 after the fifth rising edge 334 of clock signal CLOCK 204. The high voltage level at 332 activates the precharge bias circuits to precharge the bit lines in memory bank 28b. In one embodiment of a synchronous precharge scheme, memory bank one precharge signal PCG_BK1 228 is set to a high voltage level at 332 after the fifth rising edge 334 of clock signal 204 and one clock cycle after the rising edge of memory bank one burst end pulse 328. In one embodiment of an asynchronous precharge scheme, memory bank one precharge signal PCG_BK1 228 is set to a high voltage level at 332 asynchronously, such as within one clock cycle of the rising edge of memory bank one burst end signal 328.

Memory bank zero precharge timer 108 is reset to supply a low voltage level memory bank zero precharge signal PCG_BK0 230 prior to executing the next AP COMMAND that addresses memory bank 28a and memory bank one precharge timer 110 is reset to supply a low voltage level memory bank one precharge signal PCG_BK1 228 prior to executing the next AP COMMAND that addresses memory bank 28b.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A random access memory comprising:
memory banks; and
precharge timers configured to receive a burst end signal that indicates the end of a burst from one of the memory banks and in response to the burst end signal provide precharge signals to the memory banks, wherein each of the precharge timers corresponds to one of the memory banks and each of the precharge timers is configured to provide one of the precharge signals to the corresponding one of the memory banks in normal mode and in test mode.

2. A random access memory comprising:
memory banks;
precharge timers configured to provide precharge signals to the memory banks, wherein each of the precharge timers corresponds to one of the memory banks and each of the precharge timers is configured to provide one of the precharge signals to the corresponding one of the memory banks in normal mode and in test mode; and
a burst control circuit configured to provide a burst end signal that indicates the end of a first burst from a first one of the memory banks.

3. The random access memory of claim 2, comprising a delay circuit configured to receive the burst end signal and provide a delayed burst end signal at the end of a second burst from a second one of the memory banks in test mode.

4. The random access memory of claim 3, comprising a precharge timer enable circuit configured to provide a precharge timer enable signal that indicates the beginning of the first burst from the first one of the memory banks.

5. The random access memory of claim 4, wherein the delay circuit is configured to receive the precharge timer enable signal and provide a delayed precharge timer enable signal that indicates the beginning of the second burst from the second one of the memory banks in test mode.

6. The random access memory of claim 5, wherein a first one of the precharge timers is configured to provide a first one of the precharge signals in response to the burst end signal after receiving the precharge timer enable signal and a second one of the precharge timers is configured to provide a second one of the precharge signals in response to the delayed burst end signal after receiving the delayed precharge timer enable signal.

7. The random access memory of claim 3, wherein the delay circuit comprises a shift register.

8. A random access memory comprising:
memory banks;
precharge timers configured to provide precharge signals to the memory banks, wherein each of the precharge timers corresponds to one of the memory banks and each of the precharge timers is configured to provide one of the precharge signals to the corresponding one of the memory banks in normal mode and in test mode; and a precharge timer enable circuit configured to provide a precharge timer enable signal to indicate the beginning of a first burst from a first one of the memory banks.

9. The random access memory of claim 8, comprising a delay circuit configured to receive the precharge timer enable signal and provide a delayed precharge timer enable signal that indicates the beginning of a second burst from a second one of the memory banks in test mode.

10. A random access memory comprising:
memory banks;
precharge timers configured to provide precharge signals to the memory banks, wherein each of the precharge timers corresponds to one of the memory banks and each of the precharge timers is configured to provide one of the precharge signals to the corresponding one of the memory banks in normal mode and in test mode; and
a burst control circuit configured to provide a burst end signal that indicates the end of each burst from each of the memory banks in normal mode.

11. The random access memory of claim 10, wherein each precharge timer is configured to provide the one of the precharge signals to the corresponding one of the memory banks in response to receiving a precharge timer enable signal for the corresponding one of the memory banks and the burst end signal.

12. A random access memory comprising:
memory banks;
precharge timers configured to provide precharge signals to the memory banks, wherein each of the precharge timers corresponds to one of the memory banks and each of the precharge timers is configured to provide one of the precharge signals to the corresponding one of the memory banks in normal mode and in test mode; and
a precharge timer enable circuit configured to provide precharge timer enable signals to indicate the beginning of each burst from each of the memory banks in normal mode.

13. The random access memory of claim 12, wherein each precharge timer is configured to provide the one of the precharge signals to the corresponding one of the memory banks in response to receiving one of the precharge timer enable signals for the corresponding one of the memory banks and a burst end signal.

14. A random access memory comprising:
memory banks;
precharge timers configured to provide precharge signals to the memory banks, wherein each of the precharge timers corresponds to one of the memory banks and each of the precharge timers is configured to provide one of the precharge signals to the corresponding one of the memory banks in normal mode and in test mode; and
a multiplexer configured to supply a burst end signal and a precharge timer enable signal to one of the precharge timers in normal mode and a delayed burst end signal and a delayed precharge timer enable signal to the one of the precharge timers in test mode.

15. A random access memory comprising:
memory banks; and
precharge timers configured to provide precharge signals to the memory banks, wherein each of the precharge timers corresponds to one of the memory banks and each of the precharge timers is configured to provide one of the precharge signals to the corresponding one of the memory banks in normal mode and in test mode and each of the precharge timers is configured to delay and synchronize with a clock signal the one of the precharge signals provided to the corresponding one of the memory banks.

16. A random access memory comprising:
memory banks; and
precharge timers configured to provide precharge signals to the memory banks, wherein each of the precharge timers corresponds to one of the memory banks and each of the precharge timers is configured to provide one of the precharge signals to the corresponding one of the memory banks in normal mode and in test mode and each of the precharge timers is configured to asynchronously provide the one of the precharge signals to the corresponding one of the memory banks.

17. A memory control circuit comprising:
an enable circuit configured to provide a first enable signal that indicates the beginning of a first burst from a first memory bank;
a burst control circuit configured to provide a first burst end signal that indicates the end of the first burst from the first memory bank;
a delay circuit configured to delay the first enable signal and the first burst end signal in test mode; and
a precharge timer configured to provide a first precharge signal to a second memory bank in response to receiving the delayed first burst end signal and the delayed first enable signal.

18. The memory control circuit of claim 17, wherein:
the enable circuit is configured to provide a second enable signal that indicates the beginning of a second burst from the second memory bank in normal mode;
the burst control circuit is configured to provide a second burst end signal that indicates the end of the second burst from the second memory bank in normal mode; and
the precharge timer is configured to provide a second precharge signal to the second memory bank in response to receiving the second burst end signal and the second enable signal in normal mode.

19. The memory control circuit of claim 17, wherein the precharge timer is configured to provide the first precharge signal one clock cycle after receiving the delayed first burst end signal.

20. The memory control circuit of claim 17, wherein the precharge timer is configured to provide the first precharge signal asynchronously after receiving the delayed first burst end signal.

21. The memory control circuit of claim 17, wherein the delay circuit comprises a shift register.

22. The memory control circuit of claim 17, comprising a multiplexer configured to receive the delayed first burst end signal and the delayed first enable signal and provide the delayed first burst end signal and the delayed first enable signal to the precharge timer in the test mode.

23. A random access memory comprising:
means for supplying a signal that indicates the end of a data burst;
means for delaying the signal;
means for synchronizing the delayed signal with a clock signal;
means for supplying a first precharge signal to a first memory bank in response to the signal; and means for supplying a second precharge signal to a second memory bank in response to the delayed and synchronized signal.

24. The random access memory of claim 23, wherein the means for delaying the signal and the means for synchronizing the delayed signal comprises a shift register.

25. The random access memory of claim 23, comprising:
means for selecting the delayed and synchronized signal in test mode.

26. The random access memory of claim 23, wherein the means for selecting the delayed and synchronized signal in test mode comprises a multiplexer.

27. A method of automatically precharging in a random access memory, comprising
supplying a first signal that indicates the end of a first data burst;
supplying a second signal in normal mode that indicates the end of a second data burst;
delaying the first signal in test mode;
selecting the second signal in normal mode and the delayed first signal in test mode;
supplying a precharge signal from a precharge timer in response to the selected signal.

28. The method of claim 27, comprising:
supplying a first enable signal;
delaying the first enable signal in test mode;
supplying the delayed first enable signal to the precharge timer in test mode.

29. The method of claim 28, comprising:
supplying a second enable signal in normal mode; and
supplying the second enable signal to the precharge timer in normal mode.

30. The method of claim 27, wherein supplying the precharge signal comprises:
delaying the precharge signal; and
synchronizing the precharge signal to a clock signal.

31. The method of claim 27, wherein supplying the precharge signal comprises:
supplying the precharge signal asynchronously in response to the selected signal.

32. The method of claim 27, comprising:
supplying the first data burst and the second data burst in sequential order in normal mode; and
interleaving the first data burst and the second data burst in test mode.

* * * * *